United States Patent [19]
Giebel et al.

[11] Patent Number: 4,750,158
[45] Date of Patent: Jun. 7, 1988

[54] INTEGRATED MATRIX OF NONVOLATILE, REPROGRAMMABLE STORAGE CELLS

[75] Inventors: Burkhard Giebel, Denzlingen; Thomas Fischer, Umkirch, both of Fed. Rep. of Germany

[73] Assignee: ITT Industries, Inc., New York, N.Y.

[21] Appl. No.: 461,791

[22] Filed: Jan. 28, 1983

[30] Foreign Application Priority Data

Feb. 18, 1982 [EP] European Pat. Off. ........ 82200197.0

[51] Int. Cl.[4] .............................................. G11C 7/00
[52] U.S. Cl. .................................... 365/200; 365/230
[58] Field of Search ...................... 365/200, 210, 230; 371/10, 11

[56] References Cited

U.S. PATENT DOCUMENTS 4,047,163  9/1977  Choate et al. ...................... 365/200
4,428,068  1/1984  Baba .................................. 365/200

Primary Examiner—Joseph A. Popek
Attorney, Agent, or Firm—T. L. Peterson

[57] ABSTRACT

In an integrated matrix of nonvolatile, reprogrammable storage cells, additional memory is provided to replace defective rows of storage cells. The addresses of the defective rows are stored in a region of the matrix. A correction register can be loaded with the addresses of the defective rows from the region of the matrix when power is first applied to the matrix or whenever the applied power deviates from the expected, nominal value.

4 Claims, 1 Drawing Sheet

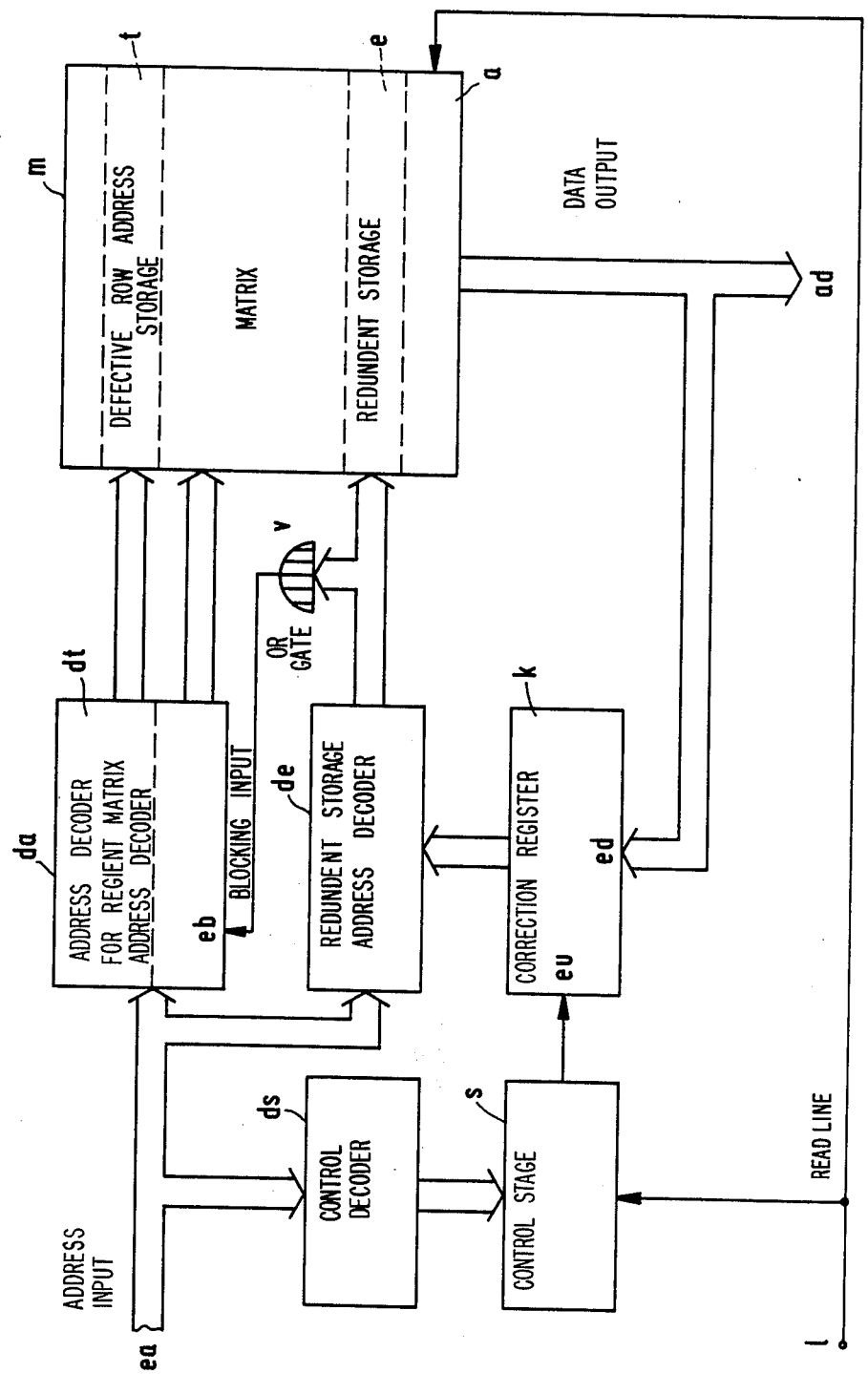

INTEGRATED MATRIX OF NONVOLATILE, REPROGRAMMABLE STORAGE CELLS

BACKGROUND OF THE INVENTION

The invention relates to an integrated matrix of nonvolatile, reprogrammable storage cells of which one section serves as a redundant memory, or in which a redundant memory is provided. The rows of the redundant memory replace defective matrix rows whose addresses, subsequently to the testing of the matrix, are stored in a read-only memory (ROM) and in correcting (patch) registers of the static, volatile storage cells. During the operational occurrence of addresses associated with defective matrix rows, the corresponding rows of the redundant memory are activated and the defective matrix rows are blocked.

Accordingly, the invention deals with so-called redundant memories in which the number of storage cells exceeds the number of actually required storage cells. As a result, unserviceable, or defective storage cells can be replaced by the redundant storage cells. The invention is based on a prior art as disclosed in the technical journal "IEEE Journal of Solid-State Circuits," October 1978, pp. 698 to 703, in particular page 699, left-hand column. Of the three possibilities disclosed therein, for storing the addresses of the defective storage cells only the first, namely the use of static, volatile storage cells (referred to in the prior art publication as "electrically alterable latches") is of interest here. Relative to this storage variety it is stated that, owing to the volatility of this type of storage, the addresses of the defective storage cells must additionally be contained in a read-only memory. In the aforementioned publication, a magnetic "disk" memory is provided.

With a view to the integrated manufacture of such storage matrices, however, the use of magnetic storage disks represents a technique which is incompatible with the semiconductor technology. It is a basic requirement, therefore, that the functions of such a redundant memory are to be realized by employing integrated semiconductor circuit technology. It appears to be prohibitive to use magnetic disks for fixedly storing the addresses of defective storage cells if as much integration as possible is to be achieved.

The invention solves the problem of designing a redundant storage matrix by exclusively employing the means customary in semiconductor technology. Special techniques, such as the use of blowable resistors or components capable of being trimmed or adjusted with the aid of lasers referred to in the aforementioned prior art publication, as special processes, are excluded as they are only compatible with standard integrated technology by making increased investments. In fact, such special processes require an additional and considerable investment in apparatus. Especially when realizing such storage matrices on as small as possible surface area with small conductor widths and spacings, such special processes cause quite a number of difficulties.

SUMMARY OF THE INVENTION

In accordance with the invention, a system is provided which includes a matrix of nonvolatile, reprogrammable storage cells with an address input, a plurality of redundant storage cells usable to replace defective storage cells in the matrix, and a volatile correction register for storing the addresses of the defective locations in the matrix. The matrix includes means for storing a plurality of addresses corresponding to defective storage locations in the matrix. The system also includes means for coupling addresses of defective storage locations read out from said means for storing to inputs to the correction register and means for control coupled between the address input and the correction register.

The system can also include means, coupled to the correction register, for addressing the plurality of redundant storage cells with the correction register supplying addresses to the redundant storage addressing means.

BRIEF DESCRIPTION OF THE DRAWING

The single FIGURE is a schematic block diagram of a matrix according to the invention, consisting of nonvolatile, reprogrammable storage cells.

DETAILED DESCRIPTION OF THE PREFERRED EMBODIMENTS

With respect to the FIGURE, a matrix m, as is generally the case, consists of nonvolatile reprogrammable storage cells arranged in rows and columns. With respect to the drawing, it shall be assumed that the storage of information and the access to this information is substantially effected in a row-wise fashion. A region e, indicated by the dashlines in the lower part of the matrix m, serves as the redundant memory e. The rows of the region e replace defective matrix rows. In the upper part of the matrix m, there is shown a matrix area t consisting of intact matrix rows. The matrix area t is fixed during the process of manufacturing the matrix m and stores the addresses of defective rows in the matrix m. Finally, as the lowest part of the matrix m, there are particularly marked the data outputs a which are formed such that with the aid of the signal 1 characterizing the reading operation, the addressed, stored data are switched through to the data output ad. The data outputs a could be a plurality of gates. The individual rows of the matrix m are controlled by the addresses of these rows as applied to the address input ea, via the address decoder da. The partial decoder dt for the addresses of the rows within the fixed intact matrix portion t is shown separately in the FIGURE. To the redundant memory e there is assigned the redundant decoder de with the input thereof likewise being connected to the address input ea.

The data input ed of the patch or correction register k is connected to the data output a of the matrix m. The data transfer input eu is connected to the output of the control stage s. To the latter there are applied two kinds of input signals, viz. on one hand, the signal 1 characterizing the reading operation and, on the other hand, the output signals of a control decoder ds which is responsive to the same addresses as the partial decoder dt of the address decoder da.

Finally, the output lines of the redundant decoder de are connected via a multiple input OR gate, to the blocking input eb of the address decoder da. When operationally selecting the redundant decoder de, the corresponding outputs of the address decoder da, are not activated.

For the purpose of setting up the addresses in the correction register k corresponding to the redundant storage locations e, either at the end of each instance of turning on the operating voltage, or else when a deviation from the nominal or set-point value of the operating voltage is sensed during operation, the matrix m is fed at the address input ea with the addresses of the fixed matrix portion t. This causes the control stage s to transmit a signal which, via the data transfer input eu of the patch or correction register k opens the latter for the reception of data. The addresses of the defective rows are read out of the fixed matrix portion t, and then appear at the data output a of the matrix m and are read into the patch register k. Accordingly, the patch register k, during normal read-out operation of the matrix m, is loaded with the addresses of the defective rows, and the matrix m operates in the conventional way.

Accordingly, the invention does not need a read-only memory (ROM) which is incompatible with the semiconductor technology. Instead, a certain fixed matrix portion t of the integrated matrix m consisting of nonvolatile, reprogrammable storage cells is used to store the addresses of the defective rows. Accordingly, the main advantage of the invention results from incorporation of the addresses of the defective rows into storage locations in the matrix m. Moreover, it is possible to include the storage matrix in a larger total system. For example, it could be incorporated in a microprocessor. In which case then, for example, the reset routine thereof can be used for performing the described correction register cycled by applying the addresses of the fixed matrix portion t to the address input.

Although the specification of the invention refers only to the row-wise reading and writing of the matrix, it is within the scope of the invention to organize the matrix for column-wise addressing.

As to the storage cells, it is particularly suitable to use the various conventional types of so-called floating-gate storage cells, of. e.g., the technical journal "Electronics" of Feb. 28, 1980, pp. 113 to 117 and the German Offenlegungsschrift DE 30 07 892 A1. Other types of storage cells are also within the scope of the invention.

We claim:

1. In a system including a matrix of nonvolatile, reprogrammable storage cells with an address input, a plurality of redundant storage cells usable to replace defective storage cells in the matrix, and a volatile correction register for storing the addresses of the defective locations in the matrix, an improvement wherein:

said matrix includes means for storing a plurality of addresses corresponding to defective storage locations in said matrix;

means for coupling addresses of defective storage locations read out from said means for storing to inputs to said correction register; and means for control coupled between said address input and said correction register for controlling said correction register to accept said defective storage location inputs.

2. A system as defined in claim 1 including:

means, coupled to said correction register, for addressing said plurality of redundant storage cells with said correction register supplying addresses.

3. A system as defined in claim 2 wherein said matrix includes a storage region comprising said plurality of redundant storage cells and wherein said means for addressing said plurality of redundant storage cells includes additional means for addressing said matrix.

4. A system as defined in claim 1 including:

means for reading the contents of said means for storing a plurality of addresses in response to a selected condition having occurred.

* * * * *